(12) United States Patent
Banno

(10) Patent No.: US 6,835,661 B2
(45) Date of Patent: Dec. 28, 2004

(54) METHOD FOR MANUFACTURING OPTICAL ELEMENT

(75) Inventor: Keisui Banno, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/448,285

(22) Filed: May 30, 2003

(65) Prior Publication Data

US 2003/0231416 A1 Dec. 18, 2003

(30) Foreign Application Priority Data

Jun. 13, 2002 (JP) ........................................ 2002-172781

(51) Int. Cl.$^7$ .......................... H01L 21/302; B24B 1/00
(52) U.S. Cl. ........................................ 438/689; 451/41
(58) Field of Search ...................... 355/77, 53; 501/11, 501/903; 427/162, 165, 535; 438/689; 570/123; 422/240; 451/41, 42; 65/31; 430/5

(56) References Cited

U.S. PATENT DOCUMENTS 6,375,551 B1 * 4/2002 Darcangelo et al. .......... 451/41

2003/0045097 A1 * 3/2003 Retherford et al. ......... 438/689
2003/0077520 A1 * 4/2003 Smith ............................ 430/5

FOREIGN PATENT DOCUMENTS

JP 2001-201608 7/2001

* cited by examiner

*Primary Examiner*—Peter B. Kim
(74) *Attorney, Agent, or Firm*—Fitzpatrick, Cella, Harper & Scinto

(57) ABSTRACT

A method for manufacturing an optical element formed of $CaF_2$ is provided, the optical element exhibiting a small optical loss even when being processed with plasma treatment such as sputtering or plasma cleaning. The method for manufacturing an optical element, described above, has the steps of polishing a $CaF_2$ substrate and performing plasma treatment, such as sputtering or plasma cleaning, in a chamber in which the polished $CaF_2$ substrate is placed. In the polishing step, the thickness of a process-altered layer formed on a surface of the $CaF_2$ substrate is polished so as to be 30 nm or less, and hence there is provided a method for manufacturing an optical element capable of preventing degradation of the optical properties caused by plasma treatment.

10 Claims, 10 Drawing Sheets

WAFER PROCESS

METHOD FOR MANUFACTURING OPTICAL ELEMENT

BACKGROUND OF THE INVENTION

1. Field of the Invention

The present invention relates to methods for manufacturing optical elements, and more particularly, relates to a method for manufacturing an optical element formed of a $CaF_2$ material having resistance against plasma damage.

2. Description of the Related Art $CaF_2$ is a necessary and essential material for forming optical elements used in a vacuum ultraviolet region. The optical elements formed of a $CaF_2$ material have been used in various optical devices such as a semiconductor exposure apparatus and a broadcasting camera.

Optical elements are manufactured by polishing, cleaning, and film-forming steps, as shown in FIG. 10. After a raw material primarily composed of $CaF_2$ for an optical element is polished to form a desired shape in the polishing step, fragments of an abrasive powder and organic materials adhered to the $CaF_2$ are then removed in the cleaning step, and in the film-forming step, an optical thin film such as an antireflection film is formed on a surface of the $CaF_2$ substrate.

As a cleaning method performed in the cleaning step, for example, there may be mentioned ultraviolet cleaning using ultraviolet rays or plasma cleaning using plasma. In particular, in the case of the plasma cleaning, compared to the ultraviolet cleaning, the cleaning time can be significantly decreased.

As a film-forming method used in the film-forming step, vacuum deposition, sputtering, or the like may be mentioned. In the case of sputtering using plasma, compared to the case of vacuum deposition, the film thus formed has a high film density, and an optical thin film having superior laser and environment resistance can be formed.

However, as is the cleaning step or the film-forming step using plasma described above, when treatment generating plasma is carried out in a chamber in which an optical element formed of $CaF_2$ is placed, plasma damage is generated in the optical element. In this specification, the plasma damage means the cause of optical loss which is generated by bombardment of charged particles onto a $CaF_2$ substrate when treatment (hereinafter referred to as "plasma treatment") generating plasma, such as plasma cleaning or sputtering, is performed in a chamber in which the $CaF_2$ substrate is placed. This plasma damage results in decrease in transmittance of an optical element.

That is, in a method for manufacturing an optical element, when plasma treatment is performed in a cleaning step or a film-forming step, the cleaning time can be significantly decreased, or an optical thin film having superior laser or environmental resistance can be formed. However, on the other hand, a problem may arise in that the transmittance of the element thus formed is decreased by plasma damage.

FIG. 11 shows the difference in transmittance of a plasma-damaged $CaF_2$ substrate from that of a $CaF_2$ substrate free from plasma damage as optical loss (ratio of decrease in transmittance). In FIG. 11, the horizontal axis indicates wavelengths, and the vertical axis indicates values obtained by deducting the transmittance of a $CaF_2$ substrate which is processed with plasma treatment from that of a $CaF_2$ substrate which is not processed therewith. That is, this value of the optical loss represents the decrease in transmittance of the $CaF_2$ substrate caused by plasma treatment. The optical loss caused by plasma damage depends on output power of plasma or time exposed thereto; however, in a visible region of a wavelength from 350 to 800 nm and a vacuum ultraviolet region of a wavelength of 250 nm or less, the optical loss becomes serious.

SUMMARY OF THE INVENTION

An object of the present invention is to provide a method for manufacturing an optical element using $CaF_2$ as a raw material, in which even when plasma treatment is performed, degradation of optical properties of the optical element caused by plasma damage can be avoided or suppressed.

A method for manufacturing an optical element, according to one embodiment of the present invention, comprises the steps of polishing a $CaF_2$ substrate so that a process-altered layer formed by the polishing has a thickness of 30 nm or less, and performing plasma treatment in a chamber in which the polished $CaF_2$ substrate is placed.

Further objects, features and advantages of the present invention will become apparent from the following description of the preferred embodiments with reference to the attached drawings.

DESCRIPTION OF THE PREFERRED EMBODIMENTS

Hereinafter, a method for manufacturing an optical element, of an embodiment according to the present invention, will be described. Through intensive research, the inventor of the present invention discovered that the generation of plasma damage is caused by a process-altered layer present at the very vicinity of a surface of a $CaF_2$ substrate. When a $CaF_2$ substrate is polished in a polishing step, minute polish defects such as scratches remains on the surface of the $CaF_2$ substrate. Destruction of the surface of the $CaF_2$ substrate caused by abrasive grains results in the polish defects described above. Around this polish defect, atomic arrangement of the crystal is disordered, and a surface layer of the crystal including this disordered portion is a process-altered layer. The thickness of this process-altered layer depends on pressure in polishing, polishing speed, diameter of abrasive grains, the shape thereof, and the like.

In the crystal disordered portion of the process-altered layer, the bonding strength between atoms is decreased, and hence fluorine atoms are easily dissociated from the $CaF_2$ by bombardment of charged particles in plasma. The lattice defects generated by the dissociation of fluorine atoms form an absorption band called a color center by the interaction with electrons present in plasma, and hence the optical loss is caused primarily thereby.

That is, the process-altered layer itself does not cause an optical loss; however, when the process-altered layer is bombarded with charged particles in plasma, the optical loss is caused thereby. Hence, in order to reduce the plasma damage, the thickness of the process-altered layer is removed to the level at which the optical loss does not occur.

Figure 1:
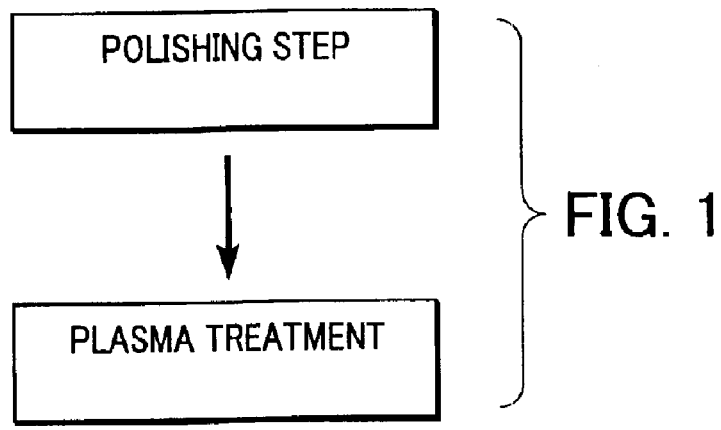
FIG. 1 is a block diagram showing the present invention.

After the description of the process-altered layer and the plasma damage for better understanding, a schematic view of the present invention is shown in FIG. 1. First, the $CaF_2$ substrate is polished in a polishing step. In this step, a process-altered layer is generated on a surface of the substrate, and the polishing is performed so that the thickness of the process-altered layer is 30 nm or less. Next, after fragments of abrasive grains and organic materials are removed in a cleaning step, an optical thin film is formed on a surface of the substrate in a film-forming step, and at this stage, plasma treatment is performed in one of the cleaning step and the film forming step or is performed in both steps. When plasma cleaning is performed in the cleaning step, the cleaning time can be significantly decreased, and when sputtering film formation is performed in the film-forming step, an optical thin film having superior laser resistance and environmental resistance can be formed. Of course, when plasma treatment is performed in both the cleaning and the film-forming steps, both effects described above can be obtained. In addition, since the thickness of the process-altered layer is decreased to 30 nm or less in the polishing step, even when plasma treatment is performed, degradation of optical properties caused thereby can be suppressed (the reason the thickness of the process-altered layer is decreased to 30 nm or less will be described later).

In view of the polishing efficiency and the like, the polishing step performs polishing at least twice under different conditions. In addition to a polishing method, the conditions mentioned above include a particle diameter of abrasive grains, a polishing speed, a pressure applied onto an element surface, and the like. In general, in the polishing step, as polishing is progressively performed, the particle diameter of abrasive grains and the pressure applied onto the element surface are preferably decreased.

In every polishing of the polishing step, the process-altered layer is generated; however, the thickness thereof depends on the particle diameter of the abrasive grains and the pressure applied onto the element surface. When the particle diameter of the abrasive grains is large and the pressure applied onto the element surface is high, a thick process-altered layer is formed, and on the other hand, when the particle diameter of the abrasive grains is small and the pressure applied onto the element surface is low, a thin process-altered layer is formed.

Figure 2A:
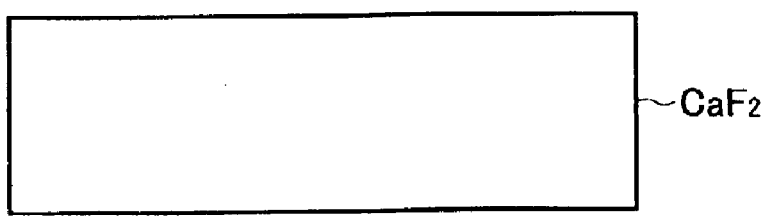
FIGS. 2A to 2C are views showing the state in which a process-altered layer is generated in a polishing step.
Figure 2B:
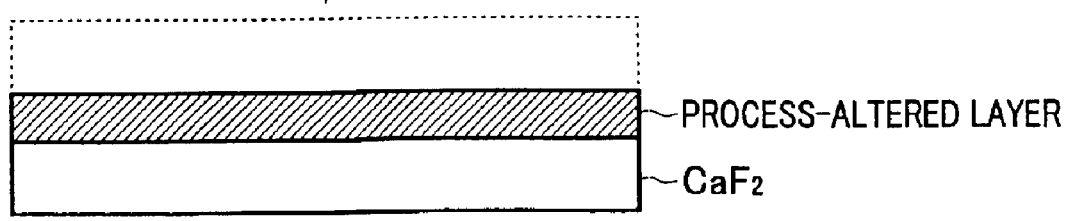
Figure 2C:
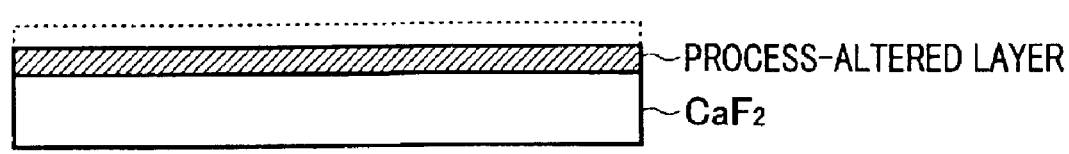

The states in which the process-altered layer is generated in the polishing step are shown in FIGS. 2A to 2C. FIG. 2A is a view showing a $CaF_2$ substrate before polishing. In first polishing, in order to polish the $CaF_2$ substrate in a large amount, abrasive particles having a large particle diameter is used and the pressure applied onto the element surface is increased. As a result, as shown in FIG. 2B, the polishing amount is increased; however, at the same time, the process-altered layer formed on the $CaF_2$ surface has a large thickness. Subsequently, finish polishing, which is the last polishing, is performed. In this polishing, the particle diameter of the abrasive grains is small, and the pressure applied onto the element surface is low. Hence, the polishing amount by the finish polishing is small, and the thickness of the process-altered layer generated in the finish polishing is small. In FIG. 2C, the $CaF_2$ substrate after finish polishing is shown. A material polished in the finish polishing is part of the process-altered layer formed in the polishing before the finish polishing. That is, the primary reason the process-altered layer is present in the optical element after the polishing step is that the process-altered layer is formed in polishing performed before the finish polishing, which is the last polishing, and dominates over the process-altered layer formed in the finish polishing.

However, in view of the surface roughness, although depending on polishing methods, the surface roughness of the $CaF_2$ after the finish polishing is approximately several angstroms and is sufficient for a practical use. Since being performed for decreasing the surface roughness, in the past, the finish polishing is stopped when the surface roughness reaches a predetermined standard value or less, and the polishing amount has not been regarded as a problem. In addition, it has not been known at all that the process-altered layer processed by plasma treatment causes the degradation of the optical properties. Hence, although a $CaF_2$ substrate processed by a conventional polishing step had a sufficient surface roughness for a practical use, a process-altered layer having a large thickness remains in the substrate.

According to the present invention, in consideration of the insufficient removal of the process-altered layer, the process-altered layer formed prior to the finish polishing is polished in the step thereof so that the thickness of the process-altered layer is decreased, and as a result, a $CaF_2$ substrate having resistance against plasma treatment can be realized.

The process-altered layer is naturally formed also in the finish polishing, the thickness thereof is significantly smaller than that formed by polishing performed before the finish polishing. Accordingly, the process-altered layer is removed in the finish polishing until the thickness of the remaining layer becomes equivalent to that formed in the finish polishing. The thickness thus obtained is the minimum thickness of the process-altered layer.

The minimum thickness of the process-altered layer depends on finish polishing methods. As the finish polishing method, for example, there may be mentioned pitch-polishing, electro-rheological polishing, and magneto-rheological polishing. In particular, in the electro-rheological polishing and the magneto-rheological polishing, compared to other polishing methods, since a pressure between abrasive grains and the surface of a substrate can be significantly decreased, the thickness of the process-altered layer can be 15 nm or less, and hence the above two polishing methods are superior as the finish polishing method.

In addition, when the polishing step is performed only by the finish polishing, that is, when the polishing is performed from the beginning under the same condition as that for the finish polishing, the thickness of the process-altered layer can always be minimum; however, in the case described above, since the polishing amount is small, and a tremendous long period of time is required for polishing, this case cannot be practically performed.

When being immersed in a solution such as an aqueous, an acidic, or an alkaline solution, the process-altered layer can be removed. However, in the case described above, the substrate surface after the process-altered layer is removed is roughened so as not to meet the standard value of the surface roughness, and as a result, after the removal of the process-altered layer, the finish polishing must be performed. Hence, compared to the present invention, the process becomes complicated since a step of immersing the substrate into the solution must be additionally performed.

According to the manufacturing method of the present invention, a high quality optical element can be obtained suppressing degradation of the optical properties in plasma treatment, which is generally caused by plasma damage. For example, the optical element according to the manufacturing method of the present invention, which is formed by the steps of polishing $CaF_2$, performing plasma cleaning, and then depositing an optical thin film on the surface of $CaF_2$ by sputtering, can be cleaned in a short period of time and has superior laser resistance and environmental resistance. Accordingly, a semiconductor exposure apparatus comprising an optical system formed of this optical element has superior laser resistance and environmental resistance.

Figure 3:
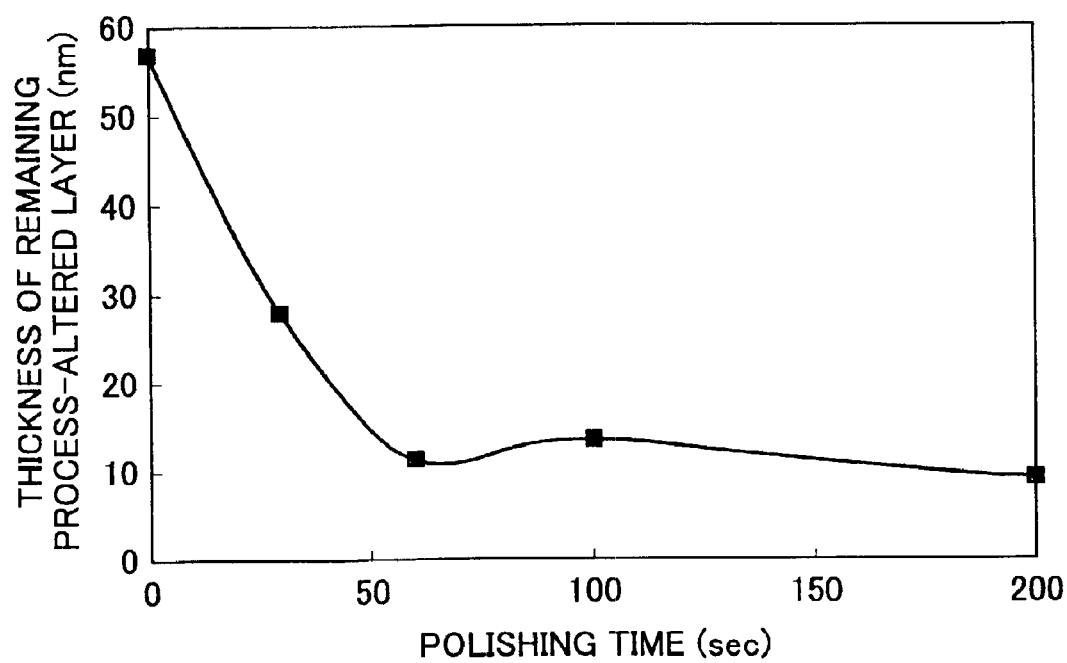
FIG. 3 is a graph showing the relationship between the time for finish polishing and the thickness of a remaining process-altered layer.

Hereinafter, an example of one embodiment according to the present invention will be described. The polishing amount of the process-altered layer depends on a polishing time for the finish polishing. FIG. 3 is a graph showing the relationship between the polishing time for the finish polishing of $CaF_2$ and the thickness of the remaining process-altered layer when a magneto-rheological polishing method is used as the finish polishing method. The thickness of the process-altered layer was identified by RBS (Rutherford Backscattering Spectrometry) channeling measurement. The thickness of the remaining process-altered layer was decreased to approximately 15 nm or less as the polishing time was increased up to approximately 60 seconds; however, subsequently, the thickness of the process-altered layer was not so much changed even when the polishing time was further increased. The reason for this is that the thickness of the process-altered layer reached to the minimum value at a polishing time of approximately 60 seconds. That is, even when some allowance for the polishing time is taken into consideration, the finish polishing performed for approximately up to 100 seconds may be sufficient. In addition, in the region in which the polishing time is 60 seconds or less, the thickness of the process-altered layer can be controlled by the polishing time.

Figure 4:
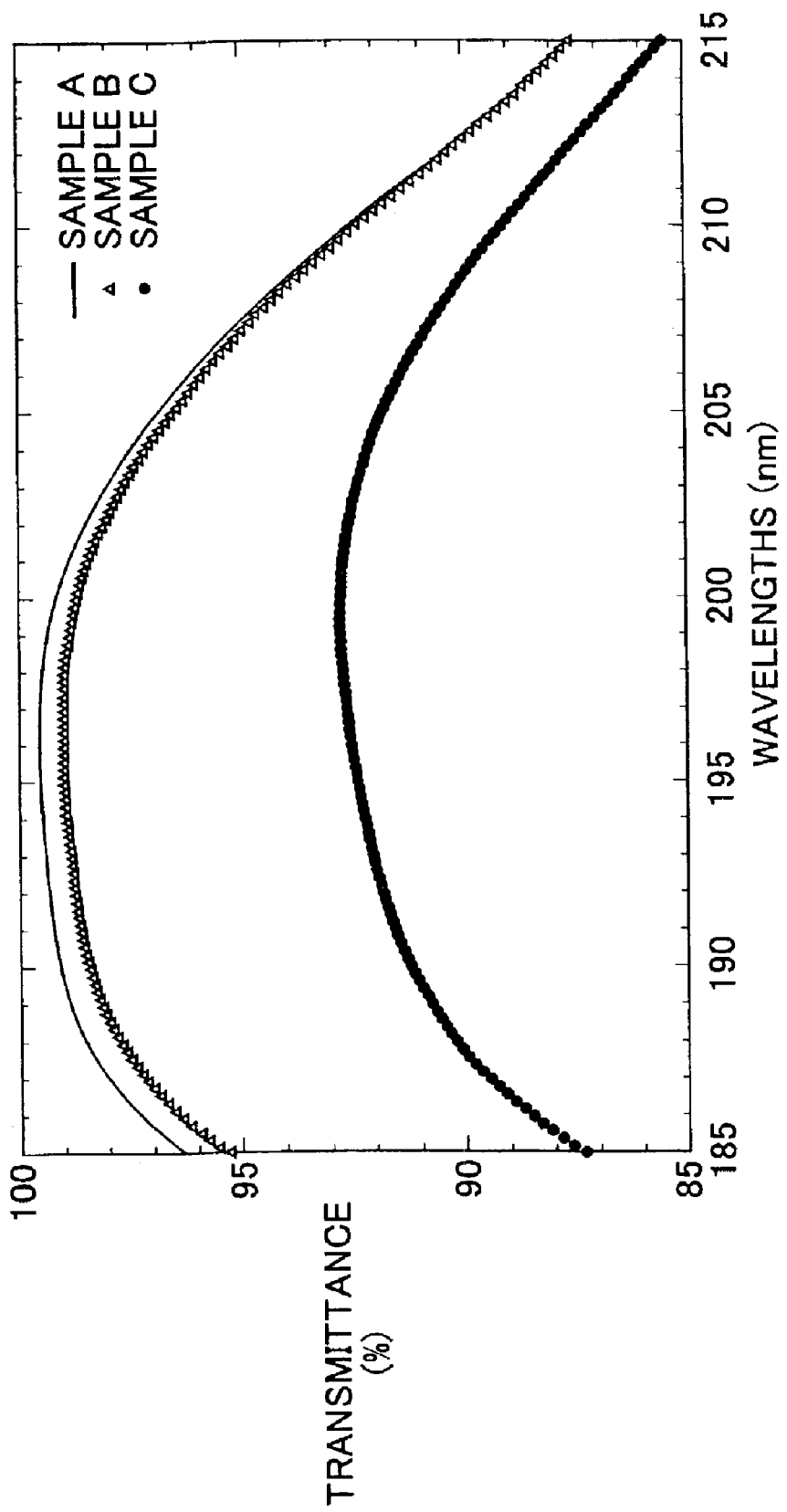
FIG. 4 is a graph showing the relationship between a process-altered layer and the optical property in a wavelength region of 185 to 215 nm of an optical element provided with an antireflection film.

For $CaF_2$ substrates having process-altered layers of different thicknesses, film formation of an antireflection layer was performed by sputtering, which was plasma treatment. In FIG. 4, the transmittance of the substrate after the film formation at a wavelength of 185 to 215 nm is shown. The thicknesses of the process-altered layer of samples A, B, and C were 15, 30, and 50 nm, respectively. According to conventional finish polishing, a process-altered layer having a thickness of approximately 50 nm, which was approximately equivalent to that of sample C, was present. According to sample B having a process-altered layer 30 nm thick, the decrease in transmittance (increase in absorption by the substrate) caused by plasma damage was 0.7% at a wavelength of 193 nm. According to sample C having a process-altered layer 50 nm thick, the decrease in transmittance (increase in absorption by the substrate) caused by plasma damage was 7.2%, and the substrate after the film formation was colored in blue. However, according to sample A having a process-altered layer 15 nm thick, the decrease in transmittance (increase in absorption by the substrate) caused by plasma damage was not observed, and as an optical element, superior properties were obtained.

Figure 5:
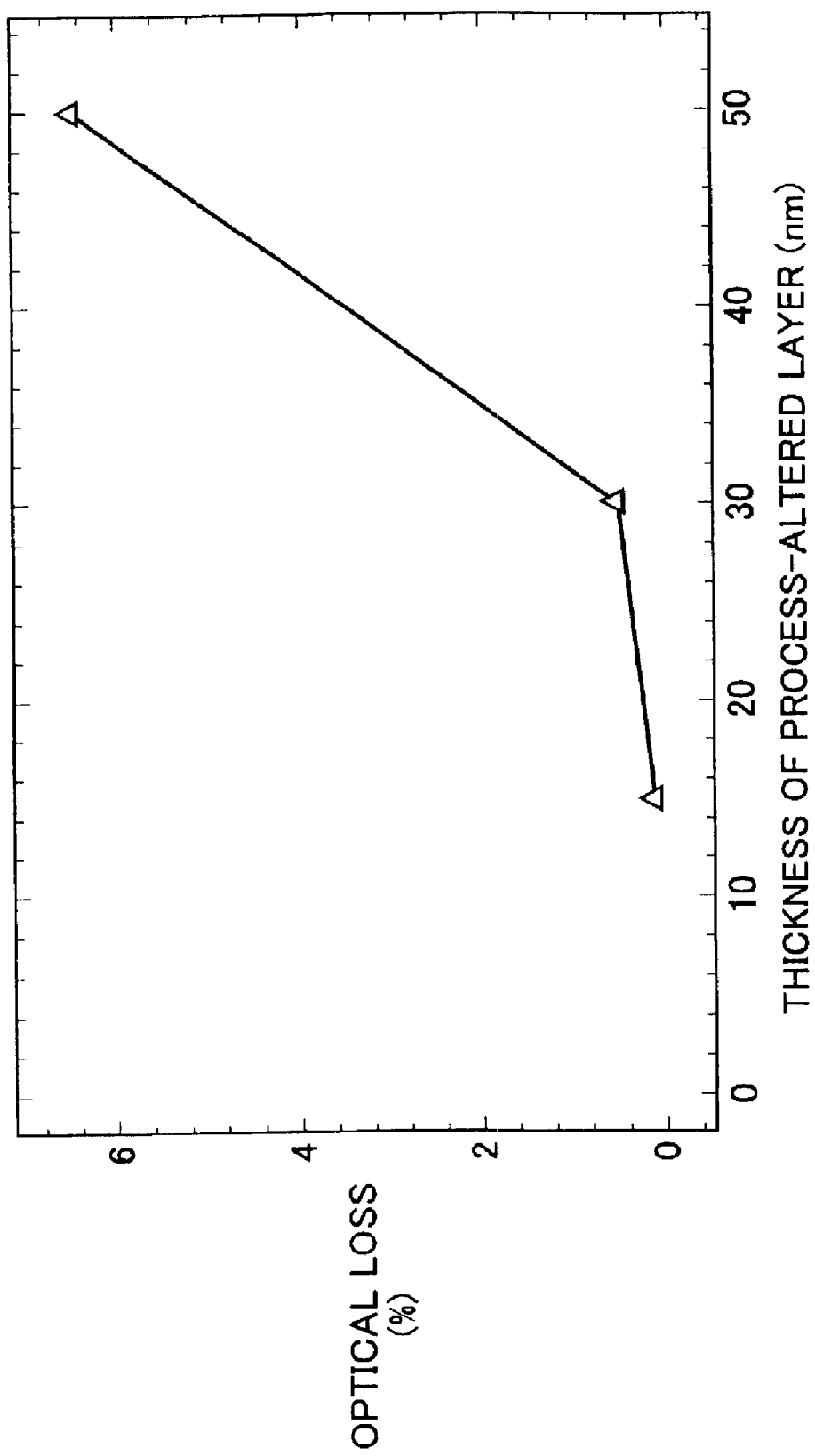
FIG. 5 is a graph showing the relationship between the thickness of a process-altered layer and the amount of optical loss caused by plasma damage.

FIG. 5 shows the relationship between the thickness of the process-altered layer and the optical loss at a wavelength of 193 nm caused by plasma damage generated in the film-forming step. As can be seen from FIG. 5, compared to the case in which the thickness of the process-altered layer is 50 nm which is equivalent to that obtained by the conventional finish polishing, when the process-altered layer has a thickness of 30 nm or less, the optical loss is decreased. That is, as the thickness of the process-altered layer is decreased, the optical loss caused by plasma damage is decreased, and then it is understood that the removal of the process-altered layer is effective to suppress the optical loss caused by plasma damage.

Figure 6:
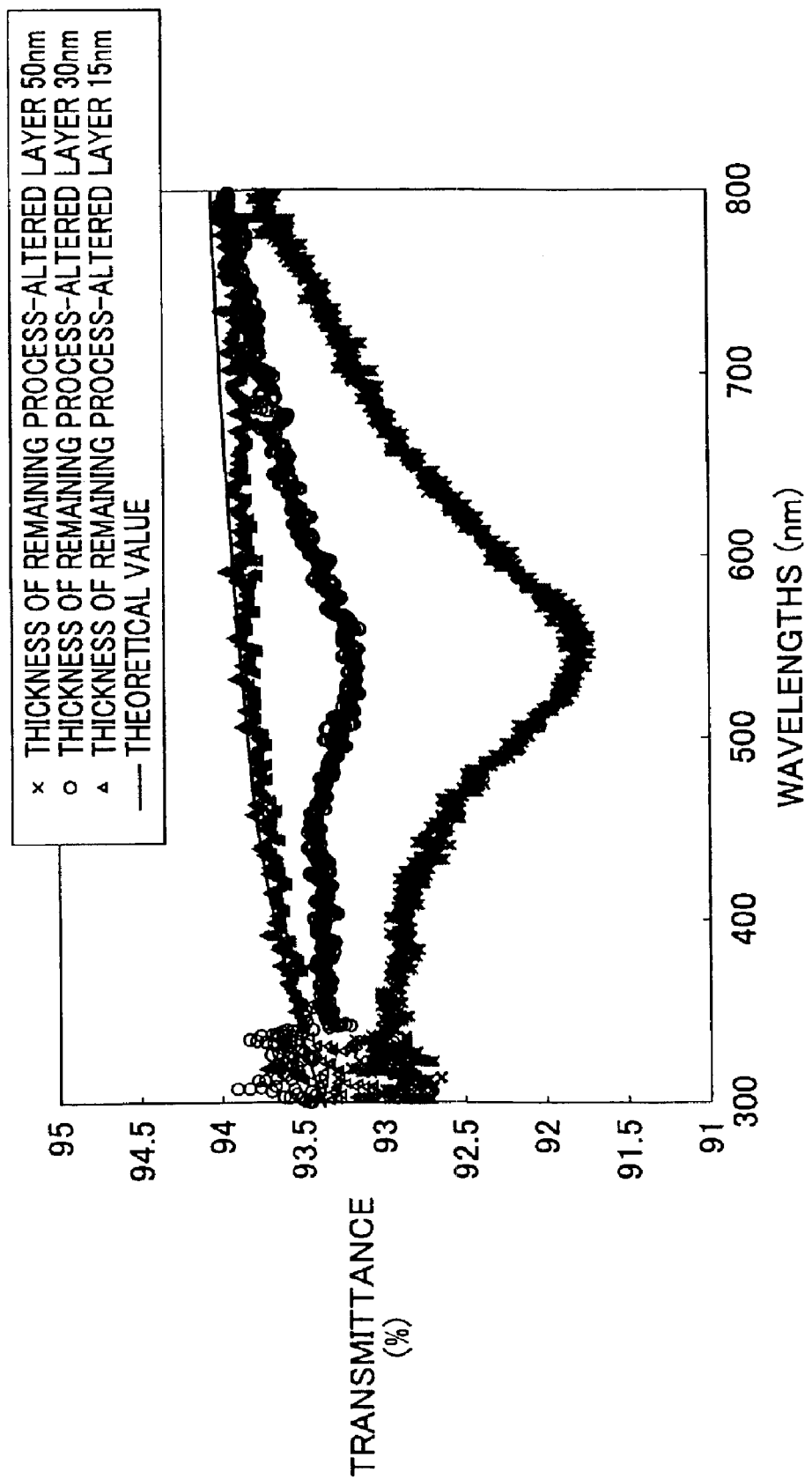
FIG. 6 is a graph showing the relationship between a process-altered layer and the optical property in a wavelength region of 300 to 800 nm of an optical element provided with an antireflection film.

In addition, it is also confirmed that, in a visible region having a wavelength from 350 to 800 nm, the optical loss caused by plasma damage can also be suppressed. In FIG. 6, the transmittance at a wavelength of 300 to 800 nm is shown. When the thickness of the process-altered layer is 50 nm, the decrease in transmittance at around a wavelength of approximately 550 nm is significant; however, when the thickness is progressively decreased to 30 nm and 15 nm, the transmittance is increased, and in addition, an approximately uniform transmittance can be obtained in the entire visible region. This phenomenon is advantageous since an optical element having uniform properties in the entire visible region can be formed.

Next, an example will be described in which the optical element manufactured by the manufacturing method of the present invention is applied to a semiconductor exposure apparatus.

Figure 7:
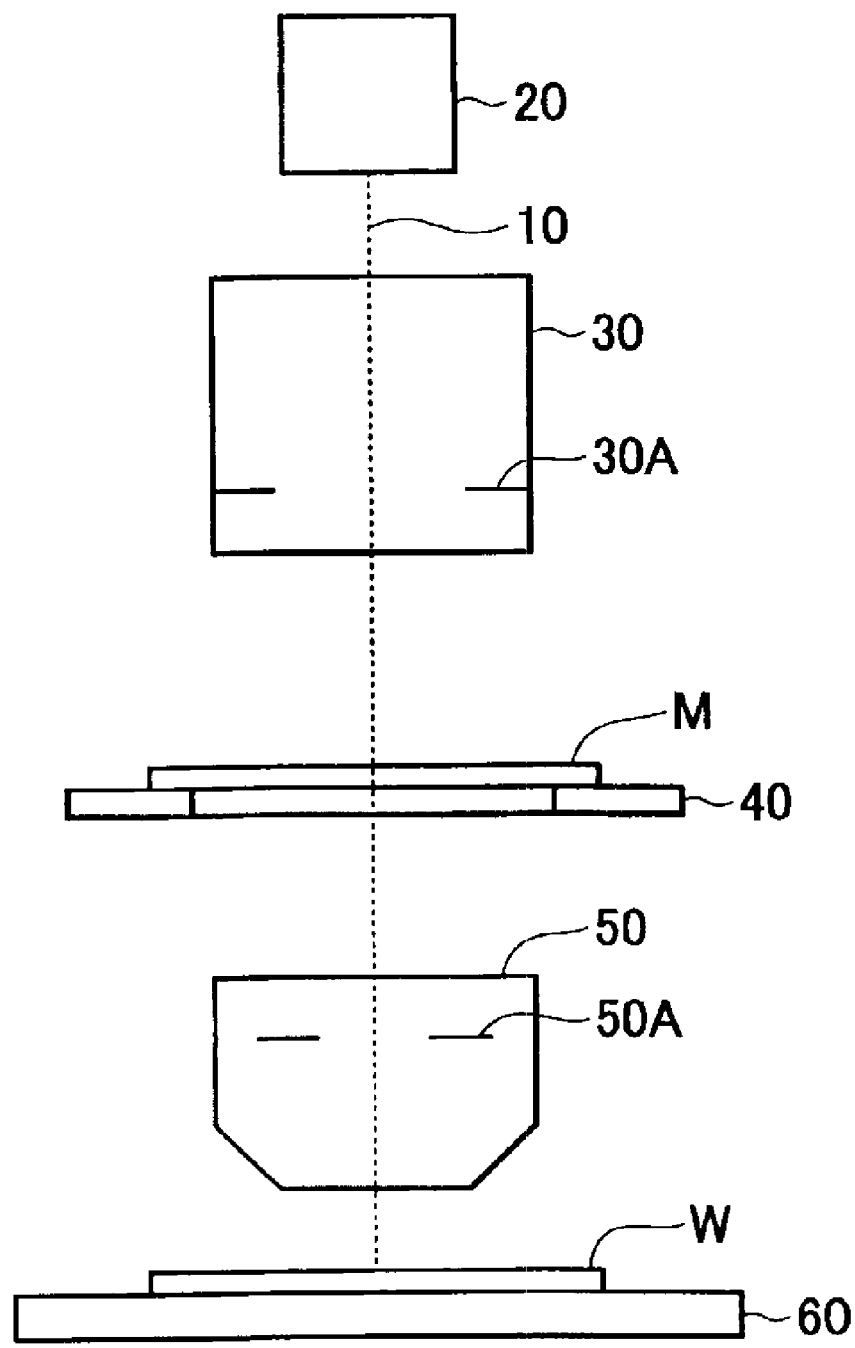
FIG. 7 is a view showing a projection type exposure apparatus having an optical system composed of $CaF_2$ used as a lens.

In FIG. 7, reference numeral 10 indicates an optical axis, numeral 20 a light source generating light having a wavelength of 157 nm in a vacuum UV region, numeral 30 an illumination optical system provided with an aperture stop 30A, numeral 40 a stage on which a reticle M is placed, numeral 50 a projection optical system provided with an aperture stop 50A, and numeral 60 a stage on which a wafer W is placed. The reticle M is irradiated with light emitted from the light source 20 through the illumination optical system 30, and an image of a device pattern of the reticle M is projected onto the wafer W by the projection optical system 50.

In each of the illumination optical system 30 and the projection optical system 50 of the projection exposure apparatus of this embodiment, the optical system is formed of a lens, made of $CaF_2$ used as a glass material, manufactured by the manufacturing method of the embodiment according to the present invention. Since the optical system is formed using the lens described above, even for light having a wavelength of 157 nm, superior transmittance can be realized.

Next, an example of a method for manufacturing a device by using the projection exposure apparatus shown in FIG. 7 will be described.

Figure 8:
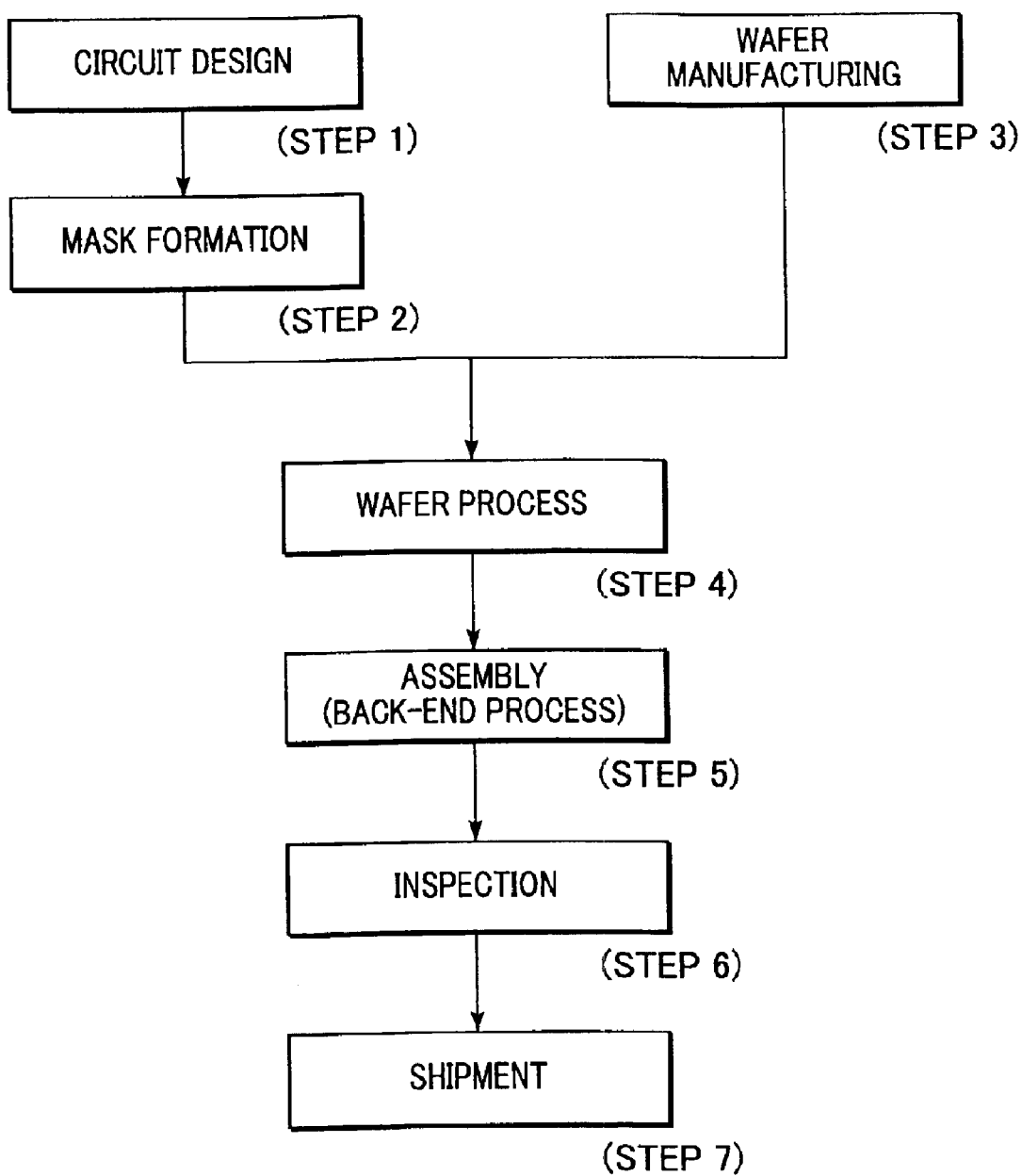
FIG. 8 is a chart showing a process for manufacturing a device.

FIG. 8 shows a manufacturing flow of a semiconductor device (a semiconductor device such as an IC or an LSI, a liquid crystal panel, a CCD, or the like). In Step 1 (circuit design), circuit design is performed for the semiconductor device. In Step 2 (mask formation), a mask (reticle) provided with the circuit pattern thus designed is formed. In addition, in Step 3 (wafer manufacturing), a wafer is manufactured using a material such as silicon. In Step 4 (wafer process) which is called a front-end process, by using the mask and the wafer thus prepared, an actual circuit is formed on the wafer by a lithography technique. Next, in Step 5 (assembly) which is called a back-end process, the wafer thus formed is processed to form semiconductor devices through chips by various steps including dicing, bonding, packaging (chip encapsulation), and the like. In Step 6 (inspection), inspections such as operation test, endurance test, and the like are performed for the semiconductor devices formed in Step 5. After the steps described above, the semiconductor devices are completed and are then shipped (Step 7).

Figure 9:
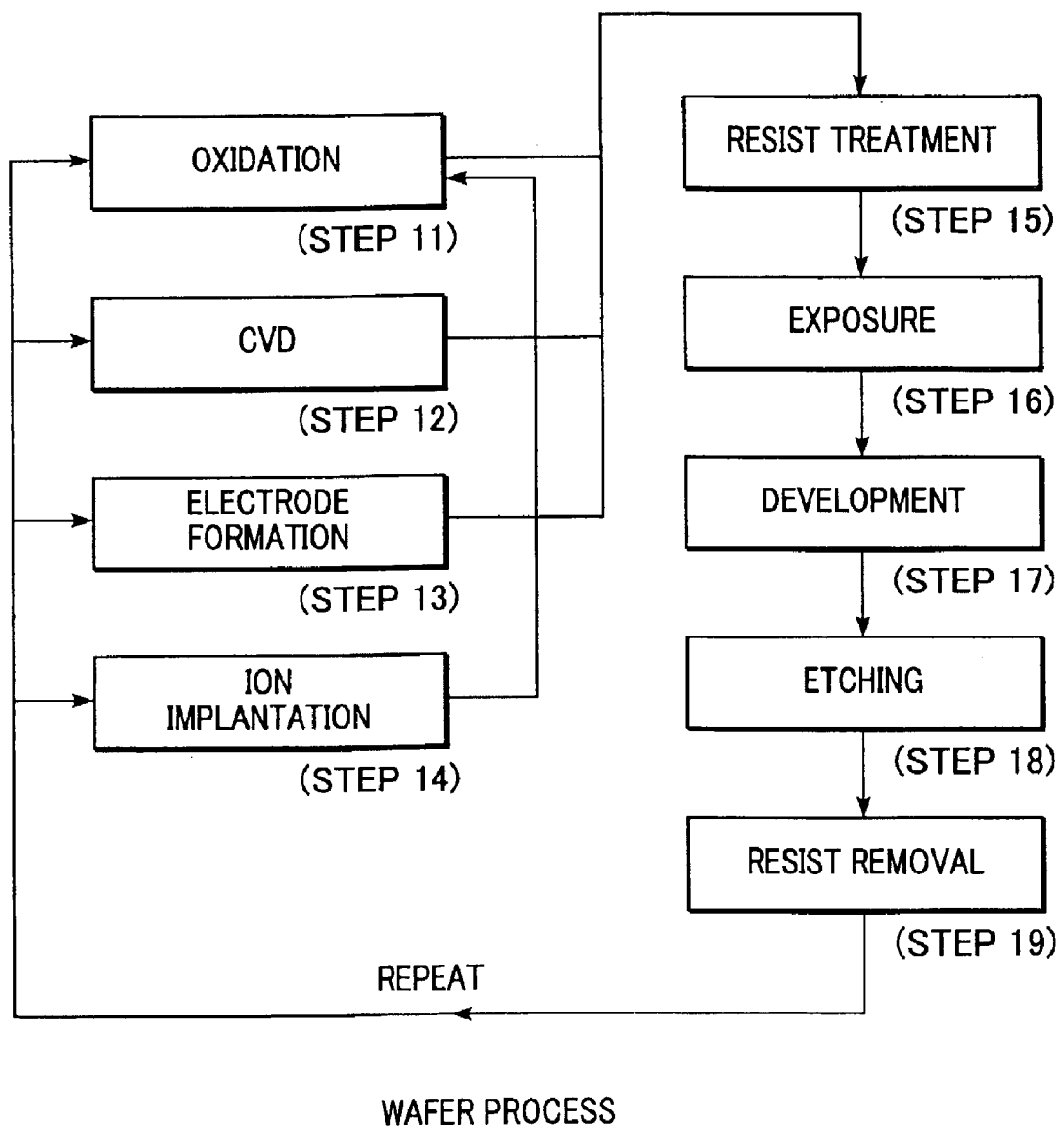
FIG. 9 is a view showing the wafer process shown in FIG. 8.
Figure 10:
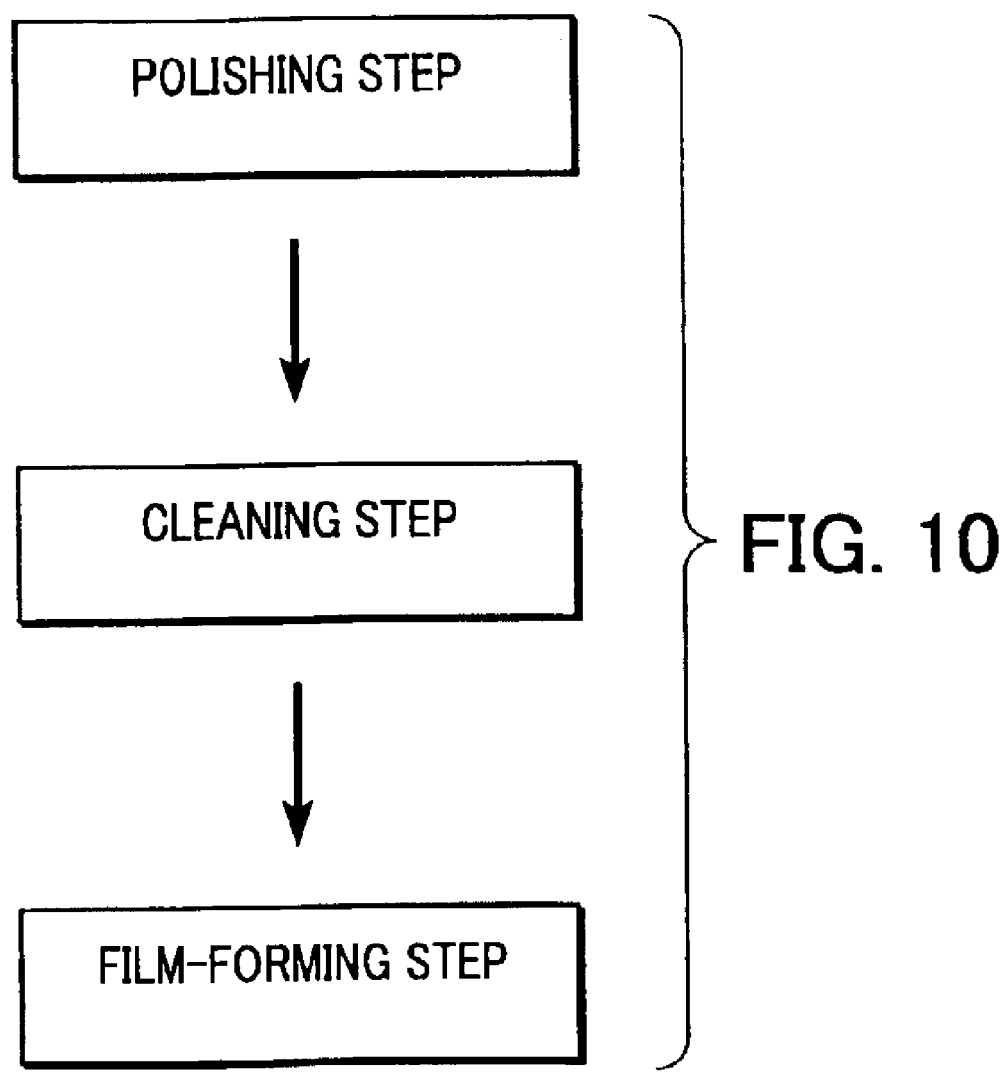
FIG. 10 is a view showing a process for manufacturing an optical element.
Figure 11:
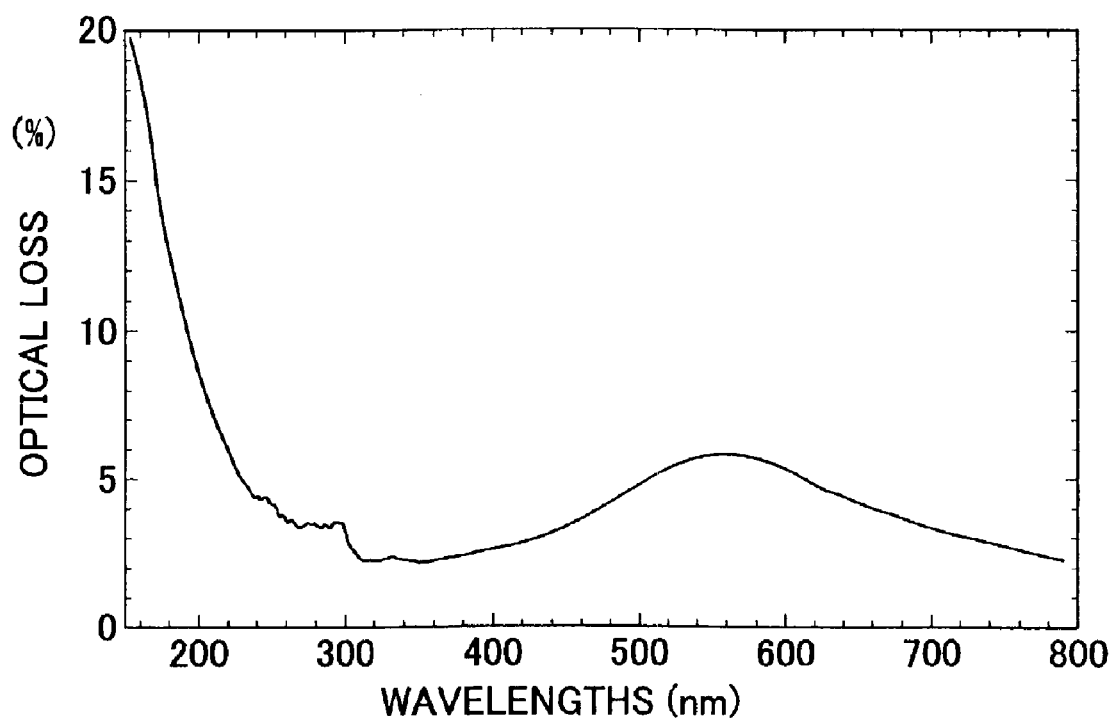
FIG. 11 is a view showing the relationship between the optical loss and the wavelength.

In FIG. 9, a detailed flow of the wafer process is shown. In Step 11 (oxidation), a surface of the wafer is oxidized. In Step 12, an insulating film is formed on the surface of the wafer. In Step 13 (electrode formation), electrodes are formed on the wafer by deposition. In Step 14 (ion implantation), ions are implanted into the wafer. In Step 15 (resist treatment), a resist (photosensitive material) is applied onto the wafer. In Step 16 (exposure), the wafer is exposed by the projection exposure apparatus using the image of the circuit pattern of the mask. In Step 17 (development), development is performed for the wafer thus exposed. In Step 18 (etching), part of the resist other than that developed in the previous step is etched away. In Step 19 (resist removal), an unnecessary resist is removed after the etching. By repeating the steps described above, the circuit patterns are formed on the wafer.

When the manufacturing method of this example is used, a highly integrated device, which has been difficult to form, can be manufactured.

As has thus been described, according to the present invention, the degradation of optical properties, caused by plasma treatment performed for an optical element formed of $CaF_2$ used as a raw material, can be prevented.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing an optical element, comprising:

a polishing step of polishing a $CaF_2$ substrate so that a process-altered layer formed by the polishing has a thickness of 30 nm or less; and a plasma step of performing plasma treatment in a chamber in which the polished $CaF_2$ substrate is placed.

2. The method for manufacturing the optical element, according to claim 1, wherein the polishing step performs polishing at least twice under different conditions so that the process-altered layer has a thickness of 30 nm or less after finish polishing which is the last polishing of the polishing step.

3. The method for manufacturing the optical element, according to claim 2, wherein the finish polishing decreases the thickness of the process-altered layer formed prior thereto to 30 nm or less.

4. The method for manufacturing the optical element, according to claim 1, wherein the thickness of the process-altered layer is 30 nm or less by RBS channeling measurement.

5. The method for manufacturing the optical element, according to claim 1, wherein the plasma step is a cleaning step of removing an organic material adhered to a surface of the polished $CaF_2$ substrate by using plasma.

6. The method for manufacturing the optical element, according to claim 1, wherein the plasma step is a film-forming step of forming a thin film on a surface of the $CaF_2$ substrate by sputtering.

7. An optical element manufactured by the manufacturing method according to claim 1, which is used for light having a wavelength of 250 nm or less and a wavelength of from 350 to 800 nm.

8. An optical system comprising:

a plurality of optical elements, wherein at least one of said plurality of optical elements is manufactured by the manufacturing method according to claim 1.

9. An exposure apparatus comprising:

a light source;

an illumination optical system; and a projection optical system, wherein the light source emits light so that a mask having a pattern is irradiated with the light through the illumination optical system, the projection optical system projects the pattern of the mask onto a wafer, and at least one of the illumination optical system and the projection optical system is the optical system according to claim 8.

10. A method for manufacturing a device, comprising the steps of:

applying a resist onto a wafer;

projecting a pattern of a mask onto the wafer for exposure using the exposure apparatus according to claim 9; and developing the exposed wafer.

* * * * *